(12) United States Patent
Yaakobi et al.

(10) Patent No.: US 8,977,936 B2
(45) Date of Patent: Mar. 10, 2015

(54) STRONG SINGLE AND MULTIPLE ERROR CORRECTING WOM CODES, CODING METHODS AND DEVICES

(75) Inventors: Eitan Yaakobi, La Jolla, CA (US); Paul Siegel, La Jolla, CA (US); Alexander Vardy, Escondido, CA (US); Toby Wolf, legal representative, La Jolla, CA (US); Jack Wolf, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 129 days.

(21) Appl. No.: 13/702,456

(22) PCT Filed: Jun. 10, 2011

(86) PCT No.: PCT/US2011/040028
§ 371 (c)(1),
(2), (4) Date: Dec. 6, 2012

(87) PCT Pub. No.: WO2011/156745
PCT Pub. Date: Dec. 15, 2011

(65) Prior Publication Data
US 2013/0091402 A1    Apr. 11, 2013

Related U.S. Application Data

(60) Provisional application No. 61/353,418, filed on Jun. 10, 2010.

(51) Int. Cl.
*H03M 13/00* (2006.01)
*G06F 11/10* (2006.01)
(Continued)

(52) U.S. Cl.
CPC .......... *G06F 11/10* (2013.01); *G06F 11/1012* (2013.01); *H03M 13/033* (2013.01);
(Continued)

(58) Field of Classification Search
CPC .......................... H03M 13/1319; H04L 1/0057
USPC ..................... 714/777, 755, 563; 711/101
See application file for complete search history.

(56) References Cited

U.S. PATENT DOCUMENTS 5,224,107 A     6/1993   Mattes
7,523,111 B2 *  4/2009   Walmsley ............................. 1/1
(Continued)

OTHER PUBLICATIONS

Fu et al., "On the Capacity and Error-Correcting Codes of Write-Efficient Memories", *IEEE Transactions on Information Theory*, vol. 46, No. 7, Nov. 2000.
Zémor, Gilles, et. al., Error-Correcting WOM-Codes *IEEE Transactions on Information Theory*, vol. 37, No. 3, May 1991.

*Primary Examiner* — Fritz Alphonse
(74) *Attorney, Agent, or Firm* — Greer, Burns & Crain, Ltd.

(57) ABSTRACT

The invention provides WOM coding methods and electronic devices with error correcting codes that provide single, double and triple error correction. In one coding, if the code corrects two/three errors, it has two/three parts of redundancy bits. For double error correction, if only one part of the redundancy bit has no errors then it is possible to correct one error. For triple error correction, if only one/two parts of the redundancy bits have no errors then it is possible to correct one/two errors. Codes that correct/detect a single, two and three cell-erasures are provided. A code that has three roots, $\alpha_1, \alpha_2, \alpha_3$, each of which is a primitive element and where every pair of roots generates a double error correcting code, is provided. Codes and coding utilizing a triple error correcting WOM code that can correct an arbitrary number of errors are provided.

10 Claims, 1 Drawing Sheet

(51) Int. Cl.
*H03M 13/03* (2006.01)
*H03M 13/13* (2006.01)
*H03M 13/15* (2006.01)
*H03M 13/19* (2006.01)
*H03M 13/29* (2006.01)

(52) U.S. Cl.
CPC ............ *H03M13/13* (2013.01); *H03M 13/152* (2013.01); *H03M 13/19* (2013.01); *H03M 13/2906* (2013.01)
USPC .......................................... 714/777; 714/755

(56) References Cited

U.S. PATENT DOCUMENTS

| | | | |
|---|---|---|---|
| 7,529,142 B2 * | 5/2009 | Widdershoven | 365/200 |
| 7,660,998 B2 * | 2/2010 | Walmsley | 713/189 |
| 2002/0136068 A1 * | 9/2002 | Widdershoven | 365/200 |
| 2004/0141358 A1 | 7/2004 | Egner | |
| 2004/0260971 A1 | 12/2004 | Ball | |
| 2012/0096234 A1 * | 4/2012 | Jiang et al. | 711/170 |

* cited by examiner

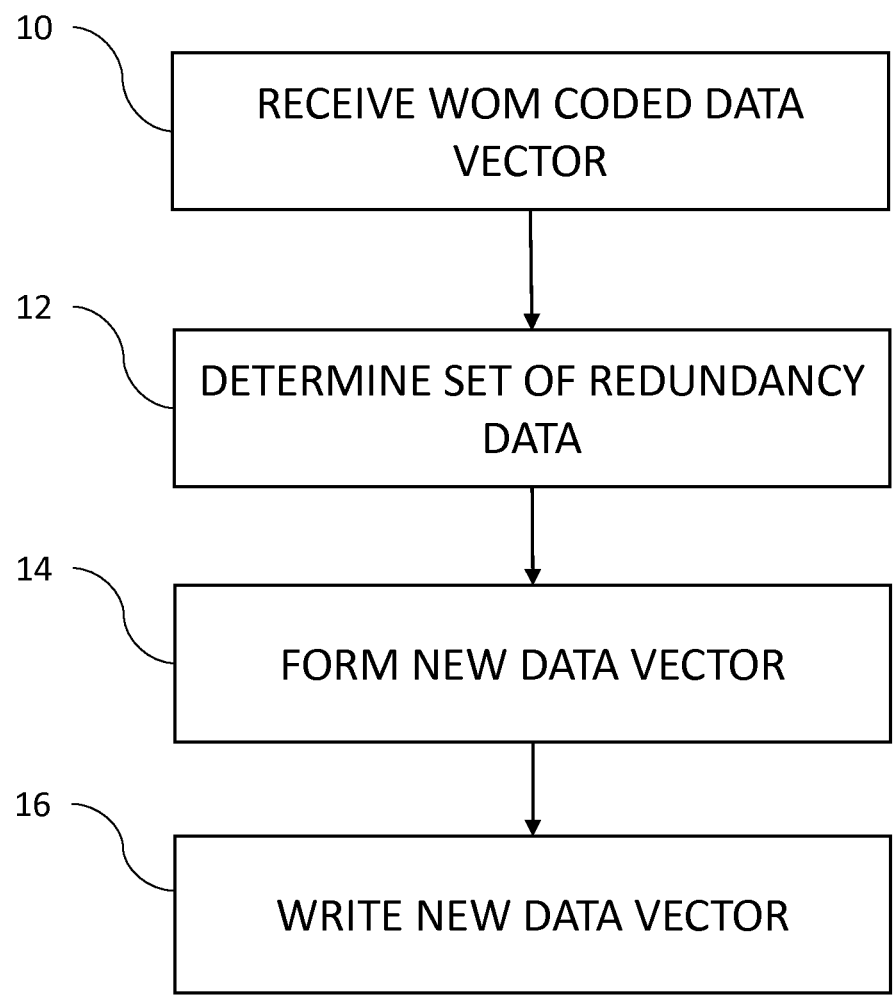

US 8,977,936 B2

STRONG SINGLE AND MULTIPLE ERROR CORRECTING WOM CODES, CODING METHODS AND DEVICES

PRIORITY CLAIM AND REFERENCE TO RELATED APPLICATION

The application claims priority under 35 U.S.C. §119 and all applicable treaties and statutes from prior provisional application Ser. No. 61/353,418, which was filed Jun. 10, 2010, and is incorporated by reference herein.

FIELD

A field of the invention is data coding and compression, and particularly Error Correcting Code schemes. Embodiments of the invention provide WOM (Write Once Memory) error correcting coding methods and devices.

BACKGROUND

A Write Once Memory (WOM) is a storage medium with binary memory elements, called cells, that can change from the zero state to the one state only once, except, in some types of memory, upon a block erase. WOM codes were originally designed for memories that consist of binary memory elements that could physically only be changed from a zero state to a one state. Examples of such memories are punch cards and optical disks. More recently, WOM codes have been designed for general usage in different types of memories, including flash memories. See, e.g., A. Jiang, "On the Generalization of Error-Correcting WOM codes," in Proc. IEEE Int. Symp. Inform. Theory, pp. 1391-1395, Nice, France (2007); A. Jiang and J. Bruck, "Joint coding for flash memory storage," in Proc. IEEE Int. Symp. Inform. Theory, pp. 1741-1745, Toronto, Canada, (July 2008); H. Mandavifar, P. H. Siegel, A. Vardy, J. K. Wolf, and E. Yaakobi, "A Nearly Optimal Construction of Flash Codes," in Proc. IEEE Int. Symp. Inform. Theory, pp. 1239-1243, Seoul, Korea, (July 2009).

WOM codes provide advantages in limiting the write-stress on multiple write memories to increase lifetime. The atomic memory element in flash memories is a floating gate cell. The cell is electrically charged with electrons and can have multiple levels corresponding to a different numbers of electrons in the cell. A typical cell is a binary cell that takes on two levels. A group of cells, typically $2^{20}$ cells, constitutes of a block. While it is possible to increase an individual cell level in the block, it is impossible to reduce its level, unless the entire block is erased and then reprogrammed. Considering rows with an "all-zero" state, information is recorded in the blocks on a row-by-row basis. However, in order to rewrite a row in a previously written block, the entire block must first be erased, returning it to the "all-zero" state. See, e.g., "Algorithms and data structures for flash memories," ACM Computing Surveys, vol. 37, pp. 138-163, (June 2005). This block erase operation introduces a significant delay and also has a detrimental effect on the lifetime of the memory. WOM codes offer a way to reduce the number of such block erasures.

WOM codes, introduced by Rivest and Shamir, permit the reuse of a WOM by taking into account the location of cells that have already been changed to the one state. See, R. L. Rivest and A. Shamir, "How to Reuse a Write-Once Memory," Inform. and Control, vol. 55, nos. 1-3, pp. 1-19, (1982). A WOM-Code $C_W[n,k,t]$ is a coding scheme for storing k information bits in n cells t times. At each write, the state of each cell can be changed, provided that the cell is changed from the zero state to the one state. The WOM-Rate of $C_W$, defined to be $Rt(C_W)=kt/n$, indicates the total amount of information that is possible to store in a cell in t writes.

Two constructions of practical error correcting WOM codes were first given by Zémor and Cohen. See, G. Zémor and G. D. Cohen, "Error-correcting WOM codes," IEEE Trans. Inform. Theory, vol. 37, no. 3, pp. 730-734, (May 1991). Both constructions correct a single cell-error during the writes. The first construction, based on a double error correcting BCH code, enables one to write k bits using $n=2^{k-1}$ cells t≈n/15.42 times. The second construction, which uses the same number of cells, is based on a triple error correcting BCH code and stores 2k bits t≈n/26.9 times.

A simple error correcting WOM code replicates each of n cells 2e+1 times to correct e or fewer errors. The error correction reduces the rate of the general WOM code by 2e+1, thus, if the rate were $Rt(C_W)$=ken for the code, then the error corrected rate is $Rt(C_W)/(2e+1)=kt/n(2e+1)$.

SUMMARY OF THE INVENTION

Preferred embodiments of the invention provide WOM coding methods and electronic devices with error correcting codes that provide single, double and triple error correction. Preferred codes of the invention also the following property: if the code corrects two/three errors it has two/three parts of redundancy bits. For double error correction, if only one part of the redundancy bit has no errors then it is possible to correct one error. For triple error correction, if only one/two parts of the redundancy bits have no errors then it is possible to correct one/two errors. Preferred methods of the invention use codes that correct/detect a single, two and three cell-errors. A preferred method of the invention applies a code that has three roots, $\alpha_1, \alpha_2, \alpha_3$, each of which is a primitive element and where every pair of roots generates a double error correcting code. Methods of the invention further provide and utilize codes utilizing a triple error correcting WOM code that can correct an arbitrary number of errors.

BRIEF DESCRIPTION OF THE DRAWING

FIG. 1 is block diagram of a preferred embodiment method for encoding WOM (write only once) data.

DETAILED DESCRIPTION OF THE PREFERRED EMBODIMENTS

Embodiments of the invention provide error correcting WOM codes with improved WOM-rates. WOM error correcting coding methods and devices of the invention have application to data communication and data storage devices including, for example, flash memory devices. Methods and devices of the invention can also be applied to WOM devices or devices that use WOM coding schemes for better performance, e.g., write-efficient memory methods that enhance the lifetime of so-called permanent memory.

Preferred embodiments of the invention provide WOM coding methods and electronic devices with error correcting codes that provide single, double and triple error correction. Preferred codes of the invention also the following property: if the code corrects two/three errors it has two/three parts of redundancy bits. For double error correction, if only one part of the redundancy bit has no errors then it is possible to correct one error. For triple error correction, if only one/two parts of the redundancy bits have no errors then it is possible to correct one/two errors. Preferred methods of the invention use codes that correct/detect a single, two and three cell-errors. A preferred method of the invention applies a code that has three roots, $\alpha_1, \alpha_2, \alpha_3$, each of which is a primitive element and where every pair of roots generates a double error correcting code. Methods of the invention further provide and utilize codes utilizing a triple error correcting WOM code that can correct an arbitrary number of errors.

Coding and devices of a first preferred embodiment provide a coding construction that can be adjusted for either single, double, or triple error correction. A preferred double-error correction code of the first embodiment has an information part and two parts of redundancy bits such that: 1) If both parts of the redundancy bits have no errors then it is possible to correct two errors in the information bits; and 2) If one part of the redundancy bits has an error then it is possible to correct a single error in the information bits using the other part of the redundancy bits.

Coding and devices of a second preferred embodiment provide triple-error correction. A preferred triple-error correction code of the second embodiment has an information part and three parts of redundancy bits such that: 1) If none of the redundancy bit parts has errors then it is possible to correct three errors in the information bits; 2) If one of the redundancy bits parts has errors then it is possible to correct two errors in the information bits; and 3) If two of the redundancy bits parts have errors then it is possible to correct one error in the information bit.

Preferred embodiments of the invention will now be discussed. The following definitions will be used in discussing the preferred embodiments:

FIG. 1 illustrates a preferred coding method that can be executed by a memory device. In the method of FIG. 1, an original data vector is received 10 by a coding device. The original data vector is WOM encoded by an arbitrary WOM code. A set of redundancy data is determined 12 for the data vector. A new data vector is formed 14. The new data vector is defined by the original data vector and the redundancy data. The new data vector is then written 16 to memory.

DEFINITIONS

1) An [n, k, t] WOM code $C_W(\epsilon_{C_W}, \mathcal{D}_{C_W})$ consists of n cells and is defined by its encoding and decoding maps, $\epsilon_{C_W}$ and $\mathcal{D}_{C_W}$, respectively. The WOM code $C_W$ guarantees any t writes of a k-bit data vector v without producing the block erasure symbol E. The rate of the WOM code $C_W$ is defined as R=kt/n;

2) An [n, k, t] WOM code that can correct e errors is an [n, k, t]-error correcting WOM code;

3) An [n, k, t] WOM code that can correct e errors is an [n, k, t] e-error detecting WOM code, with a decoding map extended to be $D_{C_W}: \{0, 1\}^n \to \{0, 1\}^k \cup \{F\}$ where F is an error detection flag.

In the discussion of preferred embodiments, there are error correcting and error detecting codes, the former providing the ability to detect and the latter the ability to correct errors. For simplicity of discussion, the example embodiments will assume the case where the same number of bits is written at each write. Artisans will appreciate that the constructions can be modified to support the case where a different number of bits is written on each write. In the discussion, it is also assumed that, if after decoding on the i-th write, a cell which is in state zero is erroneous, this error can be corrected (at least theoretically) prior to the next write by changing the state of this cell to a one. However, if after decoding on the i-th write, a cell which is in state one is erroneous, the state of this cell cannot be changed prior to the next write. In this case, however, it is assumed that on the (i+1)-st write the encoder knows that the cell's true state is a zero. Thus, there is no problem if the encoder wants to write a one in this cell. However, if the encoder wants to write a zero in this cell, then the error which was corrected on the i-th write will also occur on the (i+1)-st write because in this case it is not possible to physically change the cell's state. Stating that WOM code is an e-error correcting code indicates that the code will correct e or a fewer errors on each write but some of the errors which were corrected on one write could appear on subsequent writes. This information can be used in decoding but the decoder discussed in preferred embodiments does not do so for simplicity of explanation. It is also assumed that there are no reading errors, that is, the correct state of a cell is always read.

1. Definitions

The memory elements, called cells, have two states: zero and one. At the beginning, all the cells are in their zero state. A programming operation changes the state of a cell from zero to one. This operation is irreversible in the sense that one cannot change the cell state from one to zero unless the entire memory is first erased. The memory-state vectors are all the binary vectors of length n, $\{0,1\}^n$. The data vectors are the set of all binary vectors of length k, $\{0,1\}^k$. Any WOM code $C_W$ is specified by its encoding map $E_{C_W}$ and decoding map $D_{C_W}$. The decoding map assigns to each memory-state vector $c \in \{0,1\}^n$ its corresponding data vector $v = D_{C_W}(c) \in \{0,1\}^k$. The encoding map $E_{C_W}: \{0,1\}^k \times \{0,1\}^n \to \{0,1\}^n \cup \{E\}$ indicates for each new data vector $v \in \{0,1\}^k$ and memory-state vector $c \in \{0,1\}^n$, a new memory-state vector $c' = E_{C_W}(v,c)$ such that $D_{C_W}(c') = v$, and $c_i \leq c'_i$, for all $1 \leq i \leq n$. In case such a $c' \in \{0,1\}^n$ does not exist, the value of the encoding map is $E_{C_W(v,c)} = E$.

The error detecting and error correcting WOM codes have the following generic structure:

1. Assume that there exists an [n,k,t] WOM code $C_W(E_{C_W}, D_{C_W})$. Its n cells are denoted by $c=(c_0, \ldots, c_{n-1})$ and called the information cells. This original code $C_W$ cannot correct errors.

2. The constructed code consists of the n information cells c, and r additional cells, called the redundancy cells, and denoted by $p=(p_0, \ldots, p_{r-1})$. The redundancy cells enable the decoder to correct cell-errors. This provides an [n+r,k,t] WOM code with some error correction/detection capabilities.

2. Single-Error-Detecting WOM-Codes

Embodiments include single-error detecting WOM codes. Let $C_W(E_{C_W}, D_{C_W})$ be an [n,k,t] WOM code, and its cells, called the information cells, are denoted by $c=(c_0, \ldots, c_{n-1})$. We construct an [n+t,k,t] single-error detecting WOM code, denoted by $C_{SED}(E_{C_{SED}}, D_{C_{SED}})$.

In this construction there are t redundancy cells, denoted by $p=(p_0, p_1, \ldots, p_{t-1})$, i.e., the value of r in the general structure is t. The code $C_{SED}$ satisfies the following property: at each write, the parity of the t redundancy cells, $$\sum_{i=0}^{t-1} p_i,$$

and the parity of the n information cells, $$\sum_{i=0}^{n-1} c_i,$$

are the same.

Theorem 1. If $C_W$ is an [n,k,t] WOM code, then $C_{SED}$ is an [n+t,k,t] single-error detecting WOM code.

Proof: This theorem is proven by showing the correctness of the encoding and decoding maps. In the encoding map $E_{C_{SED}}$, the new data vector v is encoded in the DIE n information cells by the encoding map $E_{C_W}(c,v)$. If the parity of the information cells is changed, then one of the t redundancy cells is programmed. Since there are initially t redundancy cells in state zero and each time at most one of them is programmed, there is at least one unprogrammed cell at each write.

In the decoding map $D_{C_{SED}}$, at most one of the cells is in error. If the information cell's parity is different than the redundancy cell's parity, then the flag F is returned to indicate a single error detection. Otherwise, the data vector v is simply decoded by the decoding map $v = D_{C_W}(c)$.

This scheme can be applied to all known WOM codes. In particular, the next example shows how to adapt the scheme to WOM codes which are based on Hamming codes [2], [7].

Example 1

In reference [2], a construction of WOM codes, based on Hamming codes, is presented. For $k \geq 4$, the construction gives a $[2^k-1, k, 2^{k-2}+2]$ WOM code, and for $k=2,3$ a $[2^k-1, k, 2^{k-2}+1]$ WOM code. In particular, the [3,2,2] WOM code, presented by Rivest and Shamir [16], is a special case of this construction for $k=2$. Later, in [7] the case $k \geq 4$ was improved and $[2^k-1, k, 5 \cdot 2^{k-4}+1]$ WOM codes were presented.

For $k \geq 4$, Zémor showed that it is possible to change the construction such that, excluding the first write, the number of programmed cells at each write is even [24]. Therefore, the parity bit changes its values at most once. Thus, one redundancy cell is sufficient for the construction and a $[2^k, k, 5 \cdot 2^{k-4}+1]$ single-error detecting code is provided. A similar construction to this code with the same parameters was presented by Zémor in [24].

For $k=2, 3$, the construction is modified. At each write, the redundancy cells' parity is the complement of the information cells' parity. Then, at most $2^{k-2} = t-1$ cells are sufficient and thus a $[2^k+2^{k-2}-1, k, 2^{k-2}+1]$ single-error detecting code exists. The following table demonstrates the construction for the [4,2,2] single-error detecting WOM code. The bold font represents the bit in the redundancy cell. A similar table can be built for the [9,3,3] single-error detecting WOM code.

| Bits Value | First Write | Second Write |
|---|---|---|
| 00 | 0001 | 1110 |
| 01 | 0010 | 1101 |
| 10 | 0100 | 1011 |
| 11 | 1000 | 0111 |

3. Single-Error-Correcting WOM-Codes

In order to construct single-error correcting WOM codes, we start as in Section 2 with an [n,k,t] WOM code, $C_W(E_{C_W}, D_{C_W})$. Its information cells are $C = (c_0, \ldots, c_{n-1})$ and we add r redundancy cells, $p = (p_0, \ldots, p_{r-1})$, that form a word in $C_{WD}(E_{C_W}, D_{C_{WD}})$, an $[r, \lceil \log_2(n+1) \rceil, t]$ single-error detecting WOM code. Then, we construct an [n+r,k,t] single-error correcting WOM code, denoted by $C_{SEC}(E_{C_{SEC}}, D_{C_{SEC}})$, as follows.

At each write we generate a $\lceil \log_2(n+1) \rceil$-bit vector, called the syndrome and denoted by s. The syndrome will correspond to the redundancy bits of a Hamming code (or a shortened Hamming code) of length n, and will make it possible to locate an information cell in error.

Next, and in the following examples, we provide the exact specification of the given error correcting WOM codes by their encoding and decoding maps. These maps are described algorithmically using a pseudo-code notation. In this specification we will use the encoding and decoding maps $E_{C_W}$, $D_{C_W}$ of the WOM code $C_W$ and the encoding and decoding maps $E_{C_{WD}}, D_{C_{WD}}$ of the single-error detecting WOM code $C_{WD}$. We let $\alpha$ be a primitive element in the extension field $GF(2^{\lceil \log_2(n+1) \rceil})$.

Encoding Map $E_{C_{SEC}}$: The input is the memory-state vector (c,p) and the new k-bit data vector v. The output is either a new memory-state vector (c',p') or the erasure symbol E.

| | |
|---|---|
| 1. | $c' = \epsilon_{C_W}(c, v)$; |
| 2. | if (c' == E) return E; |
| 3. | $s = \Sigma_{i=0}^{n-1} c_i' \alpha^i$; |
| 4. | $p' = \epsilon_{C_{WD}}(p, s)$; |
| 5. | if (p' == E) return E; |
| 6. | return (c', p'); |

In the encoding map, $E_{C_{SEC}}$, the data vector v is encoded in the information cells c (line 1). If writing does not succeed, the symbol E is returned (line 2). Otherwise, the syndrome s of the new n information cells is calculated (line 3). Then, s is encoded in the redundancy cells using the encoding map $E_{C_{WD}}(p,s)$ (line 4). If this writing fails, the symbol E is returned (line 5); otherwise, the new memory-state vector is returned (line 6). Note that since the encoding map $E_{C_W}$ can write t messages of k-bits each and the encoding map $E_{C_{WD}}$ can write t times the $\lceil \log_2(n+1) \rceil$-bit syndrome s, the encoding map $E_{C_{SEC}}$ also can write k-bits t times.

Decoding Map $D_{C_{SEC}}$: The input is the memory-state vector (c',p'). The output is the decoded k-bit data vector v.

| | |
|---|---|
| 1. | $s'' = \mathcal{D}_{C_{WD}}(p')$; |
| 2. | if (s'' == F) |
| 3. | $\{ v = \mathcal{D}_{C_W}(c')$; return v; $\}$ |
| 4. | $s' = \Sigma_{i=0}^{n-1} c_i' \alpha^i$; |
| 5. | if (s' == s'') |
| 6. | $\{ v = \mathcal{D}_{C_W}(c')$; return v; $\}$ |
| 7. | $i = \log_\alpha (s' + s'')$; |
| 8. | $v = \mathcal{D}_{C_W}(c_0', \ldots, c_{i-1}', 1 - c_i', c_{i+1}', \ldots, c_{n-1}')$; |
| 9. | return v; |

The syndrome s'' is decoded by applying the decoding map $D_{C_{WD}}$ on the redundancy cells p' (line 1). The code $C_{WD}$ is a single-error detecting WOM code and hence by its decoding map $D_{C_{WD}}$ it is possible to determine if there is an error in one of the r redundancy cells (line 2). We distinguish between the following two cases:

1. If one of the redundancy cells is in error, i.e. the condition in line 2 holds, then there is no error in the information cells and v is decoded by the decoding map $D_{C_W}$ (line 3).

2. If there is no error in the redundancy cells, then s" is the correct value of the syndrome s. The received syndrome s' from the received n information cells is $$s' = \sum_{i=0}^{n-1} c'_i \alpha^i$$

(line 4). If s'=s" (line 5), then there is no error in the n information cells and it is possible to decode the correct value of the data vector v (line 6). Otherwise, if the i-th cell is in error, then s'+s"=$\alpha^i$. The calculation of $\log_\alpha$(s'+s") returns the value i such that $\alpha^i$=s'+s" (line 7). This identifies the erroneous cell and again can decode the data vector v (line 8).

Thus we have proved the following theorem.

Theorem 2. If $C_W$ is an [n,k,t] WOM code, $C_{WD}$ is an [r, $\lceil \log_2(n+1) \rceil$,t] single-error detecting WOM code, then $C_{SEC}$ is an [n+r,k,t] single-error correcting WOM code.

The next example demonstrates how to use this construction to build specific single-error correcting WOM codes.

Example 2

As in Example 1, the code $C_W$ is chosen to be the $[2^k-1,k, 5 \cdot 2^{k-4}+1]$ WOM code for k≥4 from [7]. Therefore, n=$2^k-1$, and $\lceil \log_2(n+1) \rceil$=k, so we can use the $[2^k, k, 5 \cdot 2^{k-4}+1]$ single-error detecting WOM code from Example 1. The resulting $[2 \cdot 2^k-1, k, 5 \cdot 2^{k-4}+1]$ single-error correcting WOM code has rate $$R = \frac{k(5 \cdot 2^{k-4}+1)}{2 \cdot 2^k - 1} > \frac{\log_2(3.2(t-1))}{6.4},$$

which is an improvement upon the constructions in [23] and the simple construction presented above.

4. Double-Error-Correcting WOM-Codes

The double-error correcting WOM codes construction is very similar to the single-error correcting case in Section 3, where the same WOM codes $C_W$, $C_{WD}$ are used. There are 2r redundancy cells, partitioned into two r-cell groups, $p_1$=($p_0$, $p_1$, ..., $p_{r-1}$) and $p_2$=($p_r$, $p_1$, ..., $p_{2r-1}$). The redundancy groups $p_1$ and $p_2$ store $\lceil \log_2(n+1) \rceil$-bit syndrome vectors $s_1$ and $s_2$, respectively. The two syndromes correspond to the two roots $\alpha, \alpha^3$ of a double-error correcting BCH code, denoted by $C_{2-BCH}$, where $\alpha$ is a primitive element in the field $GF(2^{\lceil \log_2(n+1) \rceil})$. In this construction, $\lceil \log_2(n+1) \rceil$ is assumed to be an odd integer. The code is denoted by $C_{DEC}(E_{C_{DEC}}, D_{C_{DEC}})$.

Encoding Map $E_{C_{DEC}}$: The input is the memory-state vector (c, $p_1$, $p_2$) and the new k-bit data vector v. The output is either a new memory-state vector (c',$p'_1$,$p'_2$) or the erasure symbol E.

| | |
|---|---|
| 1. | c' = $\epsilon_{C_W}$(c, v) ; |
| 2. | if (c' == E) return E; |
| 3. | $s_1 = \Sigma_{i=0}^{n-1} c'_i \alpha^i$ ; $s_2 = \Sigma_{i=0}^{n-1} c'_i \alpha^{3i}$ ; |
| 4. | $p_1' = \epsilon_{C_{WD}}(p_1, s_1)$ ; $p_2' = \epsilon_{C_{WD}}(p_2, s_2)$ ; |
| 5. | if ( ($p_1'$ == E) OR ($p_2'$ == E) ) return E; |
| 6. | return (c', $p_1'$, $p_2'$) ; |

The new k-bit data vector v is encoded in the information cells using the encoding map $E_{C_W}$ (line 1). The success of this writing is then checked (line 2). The two syndromes $s_1$, $s_2$ are calculated (line 3) and are encoded in the redundancy cells (line 4) while checking the writing success (line 5). If the last two writing operations succeed, the encoding map returns the new memory-state vector (line 6).

For the decoding map $D_{C_{DEC}}$, we use the single-error correcting WOM code decoding map $D_{C_{SEC}}$ which receives as its input n information cells and r redundancy cells. Note that while the code $C_{SEC}$ uses a fixed primitive element $\alpha \in GF(2^{\lceil \log_2(n+1) \rceil})$, it is possible to use any other primitive element in the field $GF(2^{\lceil \log_2(n+1) \rceil})$. We slightly modify the input arguments of the decoding map $D_{C_{SEC}}$ such that the primitive element is its first parameter. The modified decoding map is denoted by $D'_{C_{SEC}}$. We use the decoding map $D_{C_{2-BCH}}$ of the double-error correcting BCH code. Its input is the $2\lceil \log_2(n+1) \rceil$ syndrome bits; its output is the error vector.

Decoding Map $D_{C_{DEC}}$: The input is the memory-state vector (c',$p'_1$, $p'_2$). The output is the decoded k-bit data vector v.

| | |
|---|---|
| 1. | $s_1" = D_{C_{WD}}(p_1')$ ; $s_2" = D_{C_{WD}}(p_2')$; |
| 2. | if ($s_1"$ == F) |
| 3. | { v = $D_{C_{SEC}}'(\alpha^3, c', p_2')$ ; return v; } |
| 4. | if ($s_2"$ == F) |
| 5. | { v = $D_{C_{SEC}}'(\alpha, c', p_1')$ ; return v; } |
| 6. | $s_1' = \Sigma_{i=0}^{n-1} c'_i \alpha^i$ ; $s_2' = \Sigma_{i=0}^{n-1} c'_i \alpha^{3i}$ ; |
| 7. | if ( ($s_1'$ == $s_1"$) OR ($s_2'$ == $s_2"$) ) |
| 8. | { v = $D_{C_W}(c')$ ; return v; } |
| 9. | e' = $D_{C_{2-BCH}}(s_1' + s_1", s_2' + s_2")$ ; |
| 10. | v = $D_{C_W}(c' + e')$ ; |
| 11. | return v; |

The two syndromes $s"_1$, $s"_2$ are decoded using the redundancy cells and the decoding map $D_{C_{WD}}$ (line 1). If $s_1"$=F (line 2) then there is at least one error in the redundancy cells of group $p_1'$, and at most one error in the information cells c' and the second redundancy group $p_2'$. Therefore, it is possible to decode the data vector v by applying the decoding map $D'_{C_{SEC}}$ to the cells in c' and $p_2'$ while taking $\alpha^3$ to be the primitive element (line 3). Note that since $\lceil \log_2(n+1) \rceil$ is an odd integer, $\alpha^3$ is also a primitive element in $GF(2^{\lceil \log_2(n+1) \rceil})$. Similarly, if $s"_2$=F (line 4), then we decode by applying the decoding map $D'_{C_{SEC}}$ to the cells c' and $p'_1$, while a is the primitive element (line 5).

If according to the decoding map $D_{C_{WD}}$, no error is decoded in both the redundancy cell groups, then either there is no error in all the redundancy cells or there are exactly two errors in one of the two redundancy cell groups. First, the syndromes $s'_1$, $s'_2$ from the received n information cells are calculated (line 6). Then, we consider the following two cases:

1. If $s'_1$=$s"_1$ or $s'_2$=$s"_2$ (line 7), then necessarily there is no error in the n information cells and the k-bit data vector is calculated and returned (line 8). (This is true since if there is at least one error in the information cells then there is no error in the redundancy cells and neither of these equalities holds, which is a contradiction.)

2. If $s'_1 \neq s"_1$ or $s'_2 \neq s"_2$ (line 9) then at least one error occurred in the n information cells and no errors in the redundancy cells. The error vector is found by applying the decoding algorithm of the two-error correcting BCH code, $D_{C_{2-BCH}}$, to $s'_1+s"_1$ and $s'_2+s"_2$ (line 9). Then, we know the correct value of the n information cells and it is again possible to successfully decode the data vector v (line 10). We conclude this construction in the following theorem.

Theorem 3. If $C_W$ is an [n,k,t] WOM code, $C_{WD}$ is an [r, $\lceil \log_2(n+1) \rceil$,t] single-error detecting WOM code, and $\lceil \log_2(n+1) \rceil$ is an odd integer, then $C_{DEC}$ is an [n+2r,k,t] double-error correcting WOM code.

The construction does not work if $\lceil \log_2(n+1) \rceil$ is an even integer since $\alpha^3$ is no longer a primitive element in the field GF($2^{\lceil \log_2(n+1) \rceil}$), and thus the decoding map in line 3 cannot succeed. Clearly, it is possible to modify it by working over the field GF($2^{1+\lceil \log_2(n+1) \rceil}$) and storing syndromes of $1+\lceil \log_2(n+1) \rceil$ bits. Next, we show a modification in case that $\lceil \log_2(n+2) \rceil$ is an even integer by adding t more cells.

Assume that $\lceil \log_2(n+2) \rceil$ is an even integer. The last construction is modified and we present its differences in the encoding and decoding maps. The main modifications are as follows:

1. Instead of using the [n,k,t] WOM code $C_W$, an [n+t,k,t] single-error detecting WOM code is used and we denote it by $C'_W(E_{C_W'}, D_{C_W'})$. The t additional redundancy cells are denoted by $q=(q_0, \ldots, q_{t-1})$.

2. Instead of using the root $\alpha^3$ we use the root $\alpha^{-1}$.

3. The syndromes $s_1$ and $s_2$ are calculated according to the new roots applied to the information cells c and their parity value, which is stored in the new redundancy cells q.

The input and output to the encoding map are changed accordingly where the memory-state vector is $(c,q,p_1,p_2)$. In the first and second lines, we use the encoding map $E_{C_W'}$ instead of $E_{C_W}$ on the cells (c,q). The syndrome values in line 3 and the returned new memory-state vector in line 6 are also changed accordingly.

| | |
|---|---|
| 1. | $(c', q') = \epsilon_{C_W'}((c, q), \upsilon)$ ; |
| 2. | if ( (c', q') == E) return E; |
| 3. | $s_1 = \Sigma_{i=0}^{n-1} c_i'\alpha^i + (\Sigma_{i=0}^{t-1} q_i')\alpha^n$ ; |
| | $s_2 = \Sigma_{i=0}^{n-1} c_i'\alpha^i + (\Sigma_{i=0}^{t-1} q_i')\alpha^{-n}$ ; |
| 6. | return $(c', q', p_1', p_2')$ ; |

The decoding algorithm is also very similar. Since we use the root $\alpha^{-1}$ and also the value of the t new redundancy cells, lines 3 and 6 are changed as follows. Note that $\alpha^{-1}$ is also a primitive element and therefore the decoding map in line 3 succeeds.

| | |
|---|---|
| 3. | $\{ \upsilon = \mathcal{D}_{C_{SEC}'}(\alpha^{-1}, c', p_2')$ ; return $\upsilon$; $\}$ |
| 6. | $s_1' = \Sigma_{i=0}^{n-1} c_i'\alpha^i + (\Sigma_{i=0}^{t-1} q_i')\alpha^n$ ; |
| | $s_2' = \Sigma_{i=0}^{n-1} c_i'\alpha^{-i} + (\Sigma_{i=0}^{t-1} q_i')\alpha^{-n}$ ; |

If the decoder reaches line 9, then there is at least one error in the n information cells c' and t redundancy cells q'. The main difference in the decoding is that at this line we necessarily need to know if there is one or two cells in error among the n information cells c' and t redundancy cells q'. If there is a single error, that is, the parity of the it information cells and the parity of the t additional redundancy cells are not the same (line 9), then we can decode the data vector using the decoding map $D'_{C_{SEC}}$ with the root $\alpha$ since there is at most one error in the information cells and no error in the redundancy cells $p'_1$ (line 10). Otherwise, there are exactly two errors in the it information cells and t redundancy cells. The values of $e_1$ and $e_2$ which are calculated in line 11 are of the form $$e_1 = \alpha^i + \alpha^j,$$

$$e_2 = \alpha^{-i} + \alpha^{-j},$$

for some $0 \le i, j \le n$, $i \ne j$, and $$e_1(e_1^2 + e_1 e_2^{-1}) = (\alpha^i + \alpha^j)\left((\alpha^i + \alpha^j)^2 + (\alpha^i + \alpha^j)\frac{\alpha^{i+j}}{\alpha^i + \alpha^j}\right)$$

$$= (\alpha^i + \alpha^j)(\alpha^{2i} + \alpha^{2j} + \alpha^{i+j}) = \alpha^{3i} + \alpha^{3j}.$$

Therefore, the values of i and j, i.e. the error vector, can be found by applying the decoding procedure $D_{C_{2-BCH}}$ to $e_1$ and $e_1(e_1^2 + e_1e_2^{-1})$ (line 12). Next, the data vector can be successfully decoded (line 13). Note that the error vector in line 12 consists of n+1 bits while for the decoding map in line 13 we need only its first it bits.

| | |
|---|---|
| 9. | if ( $(\Sigma_{i=0}^{n-1} c_i') \ne (\Sigma_{i=0}^{t-1} q_i')$ ) |
| 10. | $\{ \upsilon = \mathcal{D}_{C_{SEC}'}(\alpha, c', p_1')$; return $\upsilon$; $\}$ |
| 11. | $e_1 = s_1' + s_1''$; $e_2 = s_2' + s_2''$; |
| 12. | $e' = \mathcal{D}_{C_{2-BCH}}(e_1, e_1(e_1^2 + e_1e_2^{-1}))$; |
| 13. | $\upsilon = \mathcal{D}_{C_W'}(c' + e')$ ; |
| 14. | return $\upsilon$; |

To conclude, we state the following theorem.

Theorem 4. Let $C_W$ be an [n,k,t] WOM code and $C_{WD}$ be an [r, $\lceil \log_2(n+2) \rceil$,t] single-error detecting WOM code. Suppose $\lceil \log_2(n+2) \rceil$ is an even integer. Then there exists an [n+2r+t,k,t] double-error correcting WOM code.

5. Triple-Error Correcting WOM-Codes

From the previous sections we might think that a general scheme to construct an e-error correcting WOM code is to combine an existing WOM code and a cyclic e-error correcting code, where the latter code is defined by e roots $\alpha_1, \ldots, \alpha_e$. However, not every e-error correcting code would work in this scheme. For example, in the double-error correcting construction in Section 4, the BCH code with roots $\alpha$ and $\alpha^3$ cannot work if $\lceil \log_2(n+1) \rceil$ is an even integer. This results from the fact that $\alpha^3$ is not a primitive element and hence the code generated only by $\alpha^3$ is not a single-error correcting code. For arbitrary e, if the cyclic e-error correcting code is defined by e roots, then a necessary but not sufficient condition for this scheme to work is that every subset of $k \le e$ roots generates a cyclic k-error correcting code. We state this property in the following definition.

Definition. Let n be an integer and $\alpha_1, \ldots, \alpha_e$ be e different elements in the field GF($2^n$). Let the code $C(\alpha_1, \ldots, \alpha_e)$ be a cyclic error correcting code of length $2^n-1$ with roots $\alpha_1, \ldots, \alpha_e$. The code $C(\alpha_1, \ldots, \alpha_e)$ is called a strong e-error correcting code if for every $1 \le k \le e$ and every set of k distinct elements $\alpha_{i_1}, \ldots, \alpha_{i_k} \in \{\alpha_1, \ldots, \alpha_e\}$, the code $C(\alpha_{i_1}, \ldots, \alpha_{i_k})$ is a k-error correcting code.

Next, we show how to choose the roots $\alpha_1, \alpha_2, \alpha_3$ such that $C(\alpha_1, \alpha_2, \alpha_3)$ is a strong triple-error correcting code. For the following discussion, $\alpha$ is assumed to be a primitive element in GF($2^n$). The following result was proved by Kasami in [12].

Theorem 5. Reference [12]. Let n be an odd integer and gcd(n,k)=1.

Then, $C(\alpha, \alpha^{2^k+1}, \alpha^{2^{3k}+1})$ is a cyclic triple-error correcting code.

In [1], the authors show an alternative proof to the last theorem and state the following lemma.

Lemma 6. Let n be an integer and gcd(n,k)=1. Then, $C(\alpha, \alpha^{2^k+1})$ is a cyclic double-error correcting code.

These two results imply the following lemma.

Lemma 7. Let n be an integer such that gcd(n,6)=1, and let $$k = \frac{n-1}{2}.$$

Then, the following properties hold.

1. The codes $C(\alpha)$, $C(\alpha^{2^k+1})$, $C(\alpha^{2^{3k}+1})$ are cyclic single-error correcting codes.

2. The codes $C(\alpha,\alpha^{2^k+1})$, $C(\alpha,\alpha^{2^{3k}+1})$ are cyclic double-error correcting codes.

3. The code $C(\alpha,\alpha^{2^k+1}, \alpha^{2^{3k}+1})$ is a cyclic triple-error correcting code.

Proof:

1) Since $$k = \frac{n-1}{2},$$

we know that $2^k+1$ is a divisor of $2^{n-1}-1$. Since $\gcd(2^n-1, 2^{n-1}-1)=1$, we conclude that $\gcd(2^n-1, {}^{2^k}++1)$. Therefore $\alpha^{2^k+1}$ is a primitive element in $GF(2^n)$ and the code $C(\alpha^{2^k+1})$ is a cyclic single-error correcting code. Since $\gcd(m, 6)=1$, it follows also that $\gcd(2^n-1, 2^{3k}+1)$, and therefore the code $C(\alpha^{2^{3k}+1})$ is a cyclic single-error correcting code as well.

2) Since $\gcd(n,k)=1$, the condition of Lemma 6 holds and the code $C(\alpha,\alpha^{2^n+1})$ is a double-error correcting code. Similarly, since $\gcd(n, 6)=1$" and $\gcd(n,k)=1$, it follows that $\gcd(n,3k)=1$, and again by Lemma 6, the code $C(\alpha, \alpha^{2^n+1})$ is a double-error correcting code.

2) Since $\gcd(n, 6)=1$, n is necessarily an odd integer and since $\gcd(n,k)=1$ the conditions of Theorem 5 hold. Therefore, the code $C(\alpha,\alpha^{2^k+1}, \alpha^{2^{3k}+1})$ is a triple-error correcting code.

The code $C(\alpha,\alpha^{2^k+}, \alpha^{2^{3k}+1})$ is a strong triple-error correcting code. If the code $C(\alpha^{2^k+1}, \alpha^{2^{3k}+1})$ is a double-error correcting code, the definition of an almost perfect nonlinear mapping is:

Definition. A mapping $f:GF(p^n) \to GF(p^n)$ is called an almost perfect nonlinear (APN) mapping if each equation $$f(x+a)-f(x)=b$$

for $a,b \in GF(p^n)$ and $a \neq 0$ has at most two solutions in $GF(p^n)$. If f is an APN mapping and is of the form $f(x)=x^d$ then f is called an almost perfect nonlinear power mapping.

The next lemma was proven in [12].

Lemma 8. If n is an odd integer, $$2 \leq k \leq \frac{n-1}{2}$$

and $\gcd(n,k)=1$ then the mapping $f(x)=x^{2^{2k}-2^k+1}$ over $DF(2^n)$ is an APN mapping.

Lemma 9. If n,k are integers, $\gcd(n,6)=1$ and $$k = \frac{n-1}{2},$$

then $C(\alpha^{2^k+1}, \alpha^{2^{3k}+1})$ is a double-error correcting code.

Proof: Note first that $\alpha^{2^k+1}$ is a primitive element in $GF(2^n)$ since $\gcd(2^n-1, 2^k+1)=1$. Also, $\gcd(n,k)=1$ and n is an odd integer, so, according to Lemma 8, $f(x)=x^d$ is an APN power mapping, where $d=2^{2k}-2^k+1$. We denote $\gamma=\alpha^{2^k+1}$, and hence need to prove that $C(y,y^d)$ is a double-error correcting code.

Assume to the contrary that the code is not a double-error correcting code. Clearly, there are no codewords of weight one or two and hence there exists a codeword of weight three or four. Assume there exist a codeword of Weight four. Then, there exist four integers such that $$\gamma^{i1}+\gamma^{i2}+\gamma^{i3}+\gamma^{i4}=0$$

$$(\gamma^{i1})^d+(\gamma^{i2})^d+(\gamma^{i3})^d+(\gamma^{i4})^d=0.$$

The last two equations can be written as follows $$\gamma^{i1}+\gamma^{i2}=a=\gamma^{i3}+\gamma^{i4}$$

$$(\gamma^{i1})^d+(\gamma^{i2})^d=b=(\gamma^{i3})^d+(\gamma^{i4})^d,$$

for some $a, b \in GF(2^n)$, and $a \neq 0$. Hence, the equation $$(x+a)^d+x^d=b$$

has four different $\gamma^{i1}, \gamma^{i2}, \gamma^{i3}, \gamma^{i4}$ solutions: This is a contradiction since $x^d$ is an APN mapping, The case of a codeword of weight three is handled similarly.

From Lemma 7 and Lemma 9 we conclude the following theorem.

Theorem 10. If n,k are integers, $\gcd(n,6)=1$, and $$k = \frac{n-1}{2},$$

then $C(\alpha,\alpha^{2^k+1},\alpha^{2^{3k}+1})$ is a strong triple-error correcting code.

We are now ready to show the triple-error correcting WOM code construction. Again, we use the WOM codes $C_W$, $C_{WD}$, and assume that $\gcd(\lceil \log_2(n+1) \rceil,6)=1$ and $\alpha$ is a primitive element in $GF(2^{\lceil \log_2(n+1) \rceil})$. The strong triple-error correcting is denoted by $C_3^{strong}(E_{C_3}^{strong}, D_{C_3}^{strong})$. Its roots are $\alpha_1=\alpha$, $\alpha_2=\alpha^{2^k+1}$, $\alpha_3=\alpha^{2^{3k}+1}$, where $$k = \frac{\lceil \log_2(n+1) \rceil - 1}{2}.$$

There are $3r+t$ redundancy cells, divided into four groups:

1. The first t cells $q=(q_0, \ldots, q_{t-1})$ are used with the n information cells to construct an $[n+t,k,t]$ single-error detecting WOM code $C'_W(E_{C'_W}, D_{C'_W})$.

2. The other three groups $p_1=(p_0, \ldots, p_{r-1})$, $p_2=(p_r, \ldots, p_{2r-1})$, and $p_3=(p_{2r}, \ldots p_{3r-1})$ constitutes of r cells each. The i-th group, i=1,2,3, stores the $\lceil \log_2(n+1) \rceil$-bit syndrome $s_i$ which corresponds to the root $\alpha_i$.

To conclude, we describe an $[n+t+3r,k,t]$ triple-error correcting WOM code, $C_{TEC}(E_{C_{TEC}}, D_{C_{TEC}})$.

Encoding Map $E_{C_{TEC}}$: The input is the memory-state vector and the new k-bit data vector v. The output is either a new memory-state vector $(c', q', p'_1, p_2', p_3')$ or the erasure symbol E.

1. $(c', q') = \epsilon_{C_{W'}}((c, q), v)$;
2. if $((c', q') == E)$ return E;
3. $s_1 = \Sigma_{i=0}^{n-1} c_i'\alpha_1^{id1}$; $s_2 = \Sigma_{i=0}^{n-1} c_i'\alpha_2^{id2}$; $s_3 = \Sigma_{i=0}^{n-1} c_i'\alpha_3^{id3}$;
4. $p_1' = \epsilon_{C_{WD}}(p_1, s_1)$; $p_2' = \epsilon_{C_{WD}}(p_2, s_2)$; $p_3' = \epsilon_{C_{WD}}(p_3, s_3)$;
5. if $((p_1' == E) OR (p_2' == E) OR (p_3' == E))$ return E;
6. return $(c', q', p_1', p_2' p_3')$;

The new k-bit data vector v is encoded in the information cells c and the first group of the redundancy cells q using the encoding map $E_{C'_W}$ (line 1). If this writing does not succeed the symbol E is returned (line 2). Otherwise, the three syndromes $s_1$, $s_2$, $s_3$ are calculated from the n information cells (line 3) and are encoded in the last three groups of redundancy cells (line 4) while checking their writing success (line 5). If the last three writing operations succeed, the encoding map returns the new memory-state vector (line 6).

In the decoding map, $D_{C_{TEC}}$, we use the decoding map of the double-error correcting WOM code $D_{C_{DEC}}$. Note that in the decoding map $D_{C_{DEC}}$, instead of using a double-error correcting BCH code, we can use any other cyclic double-error correcting code which is given by its two roots. Line 9 in the decoding map $D_{C_{DEC}}$ modified by substituting the decoding map of the new cyclic double-error correcting code. The input to the modified decoding map $D'_{C_{DEC}}$ is the two roots of the cyclic double-error correcting code, the n information cells, and the 2r redundancy cells, corresponding to the two syndromes of the two roots.

Decoding Map $D_{C_{TEC}}$: The input is the memory-state vector (c',q',$p_1$', $p_2$', $p_3$'). The output is the decoded data vector v.

```
1.   s₁" = 𝒟_{C_WD} (p₁'); s₂" = 𝒟_{C_WD} (p₂'); s₃" = 𝒟_{C_WD} (p₃');
2.   if (s₁" == F)
3.      { υ = 𝒟_{C_DEC}' (α₂, α₃, c', p₂', p₃'); return υ; }
4.   if (s₂" == F)
5.      { υ = 𝒟_{C_DEC}' (α₁, α₃, c', p₁', p₃'); return υ; }
6.   if (s₃" == F)
7.      { υ = 𝒟_{C_DEC}' (α₁, α₂, c', p₁', p₂'); return υ; }
8.   s₁' = Σ_{i=0}^{n-1} c'_i α₁^i; s₂' = Σ_{i=0}^{n-1} c'_i α₂^i; s₃' = Σ_{i=0}^{n-1} c'_i α₃^i;
9.   e₁ = s₁' + s₁"; e₂ = s₂' + s₂"; e₃ = s₃' + s₃";
10.  if ( (Σ_{i=0}^{n-1} c'_i) == (Σ_{i=0}^{t-1} q'_i) )
11.     { υ = 𝒟_{C_DEC} (α₁, α₂, g', p₁', p₂'); return υ; }
12.  if ( (e₁^{2^k+1} == e₂)OR(e₁^{2^{3k}+1} == e₃)
                OR(e₂^{2^{2k}-2^k+1} == e₃) )
13.     { υ = maj(𝒟_{C_SEC}' (α₁, c', p₁'), 𝒟_{C_SEC}' (α₂, c', p₂'),
                𝒟_{C_SEC}' (α₃, c', p₃') ); return υ; }
14.  e' = 𝒟_{C₃^{strong}} (e₁, e₂, e₃) ;
15.  υ = 𝒟_{C_W} (c' + e') ;
16.  return υ;
```

First, the three syndromes from the last three redundancy cell groups are decoded (line 1). If the decoded syndrome s"$_1$ is the error flag F (line 2), then there is at least one error in the group p'$_1$. In the information cells c' and redundancy cells p'$_2$, p'$_3$ there are at most two errors. Therefore, we decode by applying the decoding map $D'_{C_{DEC}}$ to c' and p'$_2$, p'$_3$ with the roots $\alpha_1, \alpha_3$ (line 3). The same procedure is applied if s"$_2$ or s"$_3$ is the error flag F (lines 4-7). Here, we use the property of $C_3^{strong}$ that every two out of its three roots generate a cyclic double-error correcting code.

After line 7, none of the syndromes s"$_1$, s"$_2$, s"$_3$ is the error flag F. Therefore, if there are errors in these redundancy cells then the number of errors in each of the three redundancy cells groups is even and since there are at most three errors, at most one group has exactly two errors. The received syndromes s'$_1$, s'$_2$, s'$_3$ from the received cells and the differences $e_1$, $e_2$, $e_3$ are calculated (lines 8 and 9). If the condition in line 10 holds, then the cells c' and q' have zero or two errors. In both cases, the cells c', p'$_1$, p'$_2$ have at most two errors so it is possible to decode (line 11).

We are left with the case where the parities of the cells c' and q' are not the same. That is, these cells have either one or three errors. We address this case in the next lemma.

Lemma 11. The condition in line 12 holds if and only if there is at most a single error in the information cells c'.

Proof: If there is at most a single error in the information cells c' then at most one of the redundancy cell groups p'$_1$, p'$_2$, p'$_3$ has two errors, that is, at least two of these groups do not have errors. If there is no error in the first and second groups and the i-th information cell c'$_i$ is in error, then $e_1 = \alpha_1^i = \alpha^i$ and $e_2 = \alpha_2^i = \alpha^{i(2^k+1)}$. Therefore, $e_1^{2^k+1} = e_2$. This condition clearly holds also if there are no errors in the information cells c'. Similarly, if there is no error in p'$_1$ and p'$_3$ then $e_1^{2^{3k}+1} = e_3$, and if there is no error in p'$_2$ and p'$_3$ then $e_2^{2^{2k}-2^k+1} = e_3$. Therefore, if there is at most a single error in the information cells c' then the condition in line 12 holds.

Now assume that there is more than one error in the information cells c'. That is, the information cells have two or three errors and in this case, there is no error in the redundancy cells p'$_1$,p'$_2$,p'$_3$ Assume that the information cells have three errors in locations i, j, l. Then, $$e_1 = \alpha^i + \alpha^j + \alpha^l$$

$$e_2 = \alpha^{i(2^k+1)} + \alpha^{j(2^k+1)} + \alpha^{l(2^k+1)}$$

$$e_3 = \alpha^{i(2^{3k}+1)} + \alpha^{j(2^{3k}+1)} + \alpha^{l(2^{3k}+1)},$$

for $0 \leq i < j < l \leq n-1$ some. In this case, $e_1^{2^k+1} \neq e_2$. Otherwise, we get $$e_1 + \alpha^i + \alpha^j + \alpha^l = 0$$

$$e_1^{(2^k+1)} + \alpha^{i(2^k+1)} + \alpha^{j(2^k+1)} + \alpha^{l(2^k+1)} = 0,$$

and $C(\alpha, \alpha^{2k+1})$ has a codeword of weight at most four, which is a contradiction. Similarly, $e_1^{2^{3k}+1} \neq e_3$ and $e_2^{2^{3k}-2^k+1} \neq e_3$. The case of two errors in the information cells is handled similarly. Hence, the condition in line 12 does not hold.

According to Lemma 11, if the condition in line 12 holds, then there is at most a single error in the information cells c'. At most one of the redundancy cell groups p'$_1$, p'$_2$, p'$_3$ has errors. Therefore, at least two out of the three decoding maps in line 13 succeed, and the function maj, which outputs the majority of the three decoded values, returns the correct value of v. In line 14, there are at most three errors in the information cells and no errors in the redundancy cell groups p'$_1$, p'$_2$,p'$_3$, p'$_4$, so it is possible to find the error vector (line 14) and decode (line 15). We conclude with the following theorem.

Theorem 12. If $C_W$ is an [n,k,t] WOM code, $C_{WD}$ is an [r, [$\log_2(n+1)$],t] single-error detecting WOM code, and gcd([$\log_2(n+1)$],6)=1, then $C_{TEC}$ is an [n+3r+t,k,t] triple-error correcting WOM code.

6. Multiple-Error Correcting WOM-Codes

An arbitrary number of errors can be corrected with an ECC WOM code. A simple scheme to construct an e-error correcting WOM code is done by using an existing WOM code and replicating each one of its cells 2e+1 times. A first improvement upon this scheme can be achieved by replicating each cell only e+1 times. Then, instead of using a regular WOM code, a single-error correcting WOM code is applied. Note that since each cell is replicated e+1 times, at most one cell in the single-error correcting WOM code will be erroneous and thus its decoding map succeeds. In the rest of the section we will show how to use similar ideas in order to construct better WOM codes that correct an arbitrary specified number of errors.

Let us first show another property of the triple-error correcting WOM code studied in Section 6.

Lemma 13. Let $C_{TEC}$ be an [n+3r+t,k,t] triple-error correcting WOM code constructed in Theorem 12. Then the code $C_{TEC}$ can correct four erasures.

Proof:

Assume first that there are no erasures in the redundancy cells groups $p_1$, $p_2$, $p_3$ then we know the correct value of the syndromes $s_1$, $s_2$, $s_3$ and in the information cells c there are at most our erasures. Since the code $C_3^{strong}$ corrects three errors, its minimum distance is at least seven and hence it can correct up to six erasures and a fortiori four erasures.

If each redundancy cell group $p_1$, $p_2$, $p_3$ has at most one error, then it is still possible to successfully decode the three syndromes since each syndrome is stored using a single-error detecting WOM code and then find the erasure cells as in the first case.

If one of the three redundancy groups has at least two erasures then in the n information cells and two other redundancy groups there are at most two erasures and again it is possible to successfully decode the erasure values.

The next theorem confirms the validity of the first construction for an e-error correcting WOM code.

Theorem 14. Let $C_{TEC}$ be an [n,k,t] triple-error correcting WOM code. Then there exists an [⌈e/2⌉n,k,t] c error e error correcting WOM code.

Proof: Let us denote the cells of the WOM code $C_{TEC}$ by $c'_0, \ldots, c'_{n-1}$. The constructed e-error correcting WOM code is denoted by $C_{eEC}$ and its ⌈e/2⌉n cells are denoted by $c_{0,0}, \ldots, c_{0,⌈e/2⌉-1}, \ldots, c_{n-1,0}, \ldots, c_{n-1,⌈e/2⌉-1}$. We use two transformations in the validation of the construction. The first transformation $$f: \{0,1\}^{⌈e/2⌉n} \to \{0,1,?\}^n,$$

transforms a memory-state vector of n cells, $$c=(c_{0,0}, \ldots, c_{0,⌈e/2⌉-1}, \ldots, c_{n-1,0}, \ldots, c_{n-1,⌈e/2⌉-1}),$$

into a memory-state vector of n cells, $$c'=(c'_0, \ldots, c'_{n-1}),$$

by taking the majority of every group of ⌈e/2⌉ cells. That is, for all $0 \le i \le n-1$ $$c'_i = maj\{c_{i,0}, \ldots, c_{i,⌈e/2⌉-1}\},$$

and in case of equality in the numbers of ones and zeros, then $c'_i = ?$, the erasure symbol. The second transformation $$g: \{0,1\}^n \to \{0,1\}^{⌈e/2⌉n},$$

transforms a memory-state vector of n cells, $$c'=c'_0, \ldots, c'_{n-1}),$$

to a memory-state vector of ⌈e/2⌉n cells, $$c=(c_{0,0}, \ldots, c_{0,⌈e/2⌉-1}, \ldots, c_{n-1,0}, \ldots, c_{n-1,⌈e/2⌉-1},$$

such that for all $0 \le i \le n-1$ and $0 \le j \le ⌈e/2⌉-1$, $$c_{i,j}=c'_i.$$

That is, every cell is replicated ⌈e/2⌉ times.

In the encoding map $\epsilon_{C_{eEC}}$, the new vector data v and memory-state vector c of ⌈e/2⌉n cells are received. Then, the new memory-state vector is updated according to $$g(\epsilon_{C_{TEC}}(f(c),v)).$$

First, a memory-state vector of n cells is generated by the transformation f on the memory-state vector of the ⌈e/2⌉n cells, c. Then, the encoding map $\epsilon_{C_{TEC}}$ is invoked on the memory-state vector f(c) and data vector v. Finally, the new memory-state vector of n cells is transformed back to ⌈e/2⌉n cells to generate the new memory-state vector.

In the decoding map $\epsilon \mathcal{E}_{D_{eEC}}$ the memory-state vector c of ⌈e/2⌉n cells is the input and is decoded according to $$\epsilon \mathcal{E}_{D_{TEC}}(f(c)).$$

As in the encoding map, first a memory-state vector of n cells is generated from the memory-state vector of ⌈e/2⌉n cells and is the input to the decoding map of the WOM code $\mathcal{E}_{D\,TEC}$. The output data vector v from $\mathcal{E}_{D\,TEC}$ is the output data vector of the decoding map.

If there are at most e errors in the memory-state vector f (c) then there are at most three errors and erasures or exactly four erasures. Since $C_{TEC}$ is a triple-error correcting WOM code it can correct three errors and erasures and according to Lemma 13 it can correct four erasures as well.

The next example demonstrates how to use the previous construction in order to construct a four-error correcting WOM code.

Example 3

Let us start with the $[2^k-1,k, 5\cdot 2^{k-4}+1]$ WOM code for $k \ge 4$, and gcd(k,6)=1, by Godlewski [7]. First, a strong triple-error correcting code exists since we require that gcd (k,6)=1. A triple-error correcting WOM code is built using the $[2^k,k,5\cdot 2^{k-4}-1]$ single-error detecting WOM code from Example 1. This last WOM code is used as the WOM codes $C_{WD}$ and $C'_W$ in the construction of the triple-error correcting WOM codes. Hence, we get a triple-error correcting WOM code that stores k bits $5\cdot 2^{k-4}+1$ times using $$2^k-1+1+3\cdot 2^k = 4 \cdot 2^k$$

cells. Then, according to Theorem 14 there exists a $[8 \cdot 2^k,k, 5\cdot 2^{k-4}+1]$ four-error correcting WOM code.

A construction of multiple-error correcting WOM codes, based upon a recursive approach, is described as follows. Assume that C is an [n,k,t] WOM code, and assume that there exists a linear e-error correcting code of length n and redundancy r. Then, the r redundancy bits are recursively stored using another e-error correcting WOM code. This process can be recursively repeated multiple-times until it is necessary to use an e-error correcting WOM code which can be constructed according to Theorem 14. We validate the recursive step of this construction in the next theorem and then show an example of how to use the construction.

Theorem 15. Let $C_1$ be an [n,k,t] WOM code, $C_2$ be a linear e-error correcting-code of length n and redundancy r, and $C_3$ be an [m,r,t] e-error correcting WOM code, then there exists an [n+m,k,t] e-error correcting WOM code.

Proof:

The e-error correcting WOM code we construct has n+m cells which are partitioned into two groups. The first group has n cells and is denoted by $c=(c_1, \ldots, c_n)$. The second group consists of m cells and is denoted by $p=(p_1, \ldots, p_m)$.

In the encoding map the memory-state vector of n+m cells, (c, p) and new data vector v are received. The output is a new memory-state vector (c', p'). The data vector v is stored in the first n cells using the encoding map of the WOM code $C_1$, $$c'=\epsilon_{C_1}(c,v).$$

Let H be the parity check matrix of the linear e-error correcting code $C_2$. In the next step a syndrome s of r bits is calculated using the new value of the n bits, $$s = H \cdot c'.$$

Then, the syndrome s is stored in the m cells using the encoding map of the WOM code $C_3$, $$p' = \epsilon_{C_3}(p,s).$$

In the decoding map, the memory-state vector (c', p') is the input and the output is a data vector v of k bits. First, the syndrome s of r bits is decoded by applying the decoding map of the e-error correcting WOM $C_3$, $$s'' = \mathcal{D}_{C_3}(p').$$

The success of this decoding map is guaranteed since there are at most e errors in p' and the WOM code $C_3$ can correct e errors. Another syndrome is calculated from the n cells and the parity check matrix H, $$s' = H \cdot c'.$$

Note that if the memory-state vector without errors is c and e is the error-vector of weight at most e, i.e. c'=c+e, then $$H \cdot e = H \cdot (c+c') = H \cdot c + H \cdot c' = s'' + s'.$$

Therefore, the syndrome that corresponds to the error vector e is s"+s' and it is possible to find it by applying the decoding map of the code $C_2$ to s"+s', $$e = \mathcal{D}_{C_2}(s''+s').$$

Finally, the data vector v is decoded by applying the decoding map of the WOM code $C_1$ to the memory-state vector c'+e, $$v = \mathcal{D}_{C_1}(c'+e)$$

A necessary condition to efficiently apply this scheme recursively is that, r, the number of redundancy bits of the e-error correcting is not greater than the number of information bits k; otherwise the number of cells in the next step of the recursion is greater than the total number of cells n. The code constructed in Example 3 Error! Reference source not found. cannot be used for just this reason. If we start with the $[2^k-1, k, 5 \cdot 2^{k-4}+1]$ WOM code for $k \geq 4$, $\gcd(k,6)=1$, and then use a four-error correcting-code, the number of redundancy bits is roughly 4k and so the number of information bits for the next WOM code in the recursion is greater than the number of the information bits that the WOM code needs to store. The next example shows another case where this scheme can outperform the construction in Theorem 14.

Example 4

In this example we start with the [23,11,3] WOM code constructed by Cohen et al. [12]. In order to use this WOM code in a larger block of cells, one can simply repeat the WOM code in successive groups of 23 cells. For example, repeating the code 89 times provides us with a [2047,979,3] WOM code. In order to construct a four-error correcting WOM code according to the construction in Theorem 14, it is necessary to first build a triple-error correcting WOM code. In this case n=2047, $\lceil \log(n+1) \rceil = 11$, and we will construct a single-error detecting WOM code that stores 11 bits three times. This can be done according to Section 3 and the [23, 11,3] WOM code, so we receive a [26,11,3] single-error detecting WOM code. The condition of Theorem 12 holds, i.e. $\gcd(11,6)=1$, and thus we can construct a [2047+3·26+3=2128,979,3] triple-error correcting WOM code. Finally, by applying Theorem 14, we can construct a [4256,979,3] four-error correcting WOM code.

Next, we construct the code according to Theorem 15. Again, let us start with the [2047,979,3] WOM code and use a four-error correcting code of length 2047. Specifically, we use a four-error correcting BCH code of 4·11=44 redundancy bits, so we need to store 44 bits three times while correcting four errors. Therefore, we seek to use Theorem 14 and hence need to construct first a triple-error correcting WOM code which stores 44 bits three times. Note that now n=92 and $\lceil \log(n+1) \rceil = 7$, so a single-error detecting that stores seven bits three times is required. Cohen et al. [2] also constructed a [7,3,3] WOM code and therefore there exists a [14,6,3] WOM code. By simply adding three more cells to store one more bit three times we construct a [17,7,3] WOM code. The latter WOM code provides us with a [20,7,3] single-error detecting WOM code. The condition of Theorem 12 holds again, gcd (7,6)=1, and thus we construct a [92+3·20+3=155,44,3] triple-error correcting WOM code. Next, by applying Theorem 14, we can construct a [2·155=310,44,3] four-error correcting WOM code. Finally, we get a [2047+310=2357,979, 3] four-error correcting WOM code, thereby improving upon the first construction.

REFERENCES

[1] C. Bracken and T. Helleseth, "Triple-error correcting BCH-like codes." in Proc. IEEE Int. Symp. Inform. Theory. pp. 1723-1725. Seoul. Korea. June 2009.

[2] G, D, Cohen, P, Godlewski, and F Merkx, "Linear binary code for write-once memories," IEEE Trans, Inform. Theory, vol, 32, no. S, pp, 697-700, September 1986,

[3] H, Dobbertin, "Almost perfect nonlinear power functions on GF(2n): the welch case," *IEEE Trans, Inform. Theory*, vol, 45, noA, pp, 1271-1275, May 1999,

[4] A Fiat and A Shamir, "Generalized write-once memories," IEEE Trans, Inform. Theory, vol, 30, pp, 470-480, September 1984,

[5] F Fu and A J, Han Vinck, "On the capacity of generalized writeonce memory with state transitions described by an arbitrary directed acyclic graph," IEEE Trans, Inform. Theory, vol, 45, no, 1, pp, 308-313, September 1999,

[6] E. Gal and S. Toledo, "Algorithms and data structures for flash memories," ACM Computing Surveys, vol, 37, pp. 138-163, June 2005.

[7] P. Godlewski, "WOM codes construits a partir des codes de Hamming," Discrete Math., no. 65 pp. 237-243, 1987.

[8] C. Heegard, "On the capacity of permanent memory," IEEE Trans. Inform. Theory, vol, 31, no. 1, pp. 34-42, January 1985.

[9] A Jiang, "On the generalization of error correcting WOM codes," in Proc. IEEE Int. Symp. Inform. Theory, pp. 1391-1395, Nice, France, June 2007.

[10] A Jiang, V. Bohossian, and J. Bruck, "Floating codes for joint information storage in write asymmetric memories," in Proc. IEEE Int. Symp. Inform. Theory, pp. 1166-1170, Nice, France, June 2007.

[11] A Jiang and J. Bruck, "Joint coding for flash memory storage," in Proc. IEEE Int. Symp. Inform. Theory, pp. 1741-1745, Toronto, Canada, July 2008.

[12] T. Kasami, "The weight enumerators for several classes of subcodes of the second order binary Reed-Muller codes," Inform. and Control, vol, 18, pp. 369-394, September 1971.

[13] S. Kayser, E. Yaakobi, P. H. Siegel, A Vardy, and J. K. Wolf, "Multiplewrite WOM codes," in 48-th Annual Allerton Conference on Communication, Control and Computing, Monticello, Ill., September 2010.

[14] H. Mandavifar, P. H. Siegel, A Vardy, J. K. Wolf, and E. Yaakobi, "A nearly optimal construction of flash codes," in Proc. IEEE Int. Symp. Inform. Theory, pp. 1239-1243, Seoul, Korea, July 2009.

[15] F Merkx, "Womcodes constructed with projective geometries," Traitement du signal, vol, 1, no. 2-2, pp. 227-231, 1984.

[16] R. L. Rivest and A Shamir, "How to reuse a write-once memory," Inform. and Control, vol, 55, nos. 1-3, pp. I-19, December 1982.

[17] R. M. Roth, February 2010, personal communication.

[18] J. K. Wolf, A D. Wyner, J. Ziv, and J. Korner, "Coding for a write-once memory," AT&T Bell Labs. Tech. J., vol, 63, no. 6, pp. 1089-1112, 1984. [19] Y. Wu, "Low complexity codes for writing write-once memory twice," in Proc. IEEE Int. Symp. Inform. Theory, pp. 1928-1932, Austin, Tex., June 2010.

[20] Y. Wu and A Jiang, "Position modulation code for rewriting write-once memories," submitted to IEEE Trans. Inform. Theory, September 2009. Preprint available at http://arxiv.org/abs/1001.0167.

[21] E. Yaakobi, S. Kayser, P. H. Siegel, A Vardy, and J. K. Wolf, "Efficient two-write WOM codes," in Proc. IEEE Inform. Theory Workshop, Dublin, Ireland, August 2010.

[22] E. Yaakobi, P. H. Siegel, A Vardy, and J. K. Wolf, "Multiple error-correcting WOM codes," in Proc. IEEE Int. Symp. Inform. Theory, pp. 1933-1937, Austin, Tex., June 2010.

[23] G. Zémor and G. D. Cohen, "Error-correcting WOM codes," IEEE Trans. Inform. Theory, vol, 37, no. 3, pp. 730-734, May 1991.

[24] G. Zémor, "Problemes combinatoires lies a l'ecriture sur des mernoires," Ph.D. Dissertation, ENST, Paris, France, November 1989.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for encoding WOM (write only once) data, the method comprising steps of:
receiving, by an electronic device, an original data vector that is WOM encoded by an arbitrary WOM code;
determining, by the electronic device, a set of redundancy data for the data vector;
forming, by the electronic device, a new data vector that is defined by the original data vector and the redundancy data;
writing, by the electronic device, the new data vector to one or more memory cells.

2. The method of claim 1, further comprising WOM encoding, by the electronic device, the redundancy data prior to said step of forming a new data vector.

3. The method of claim 2, wherein said step of WOM encoding comprises WOM encoding using a WOM code that is different than the arbitrary WOM code of the original data vector.

4. The method of claim 2, wherein said forming further comprising calculating a syndrome of the new data vector and encoding the syndrome in an encoding map that is used for said WOM encoding of the redundancy data.

5. The method of claim 4, wherein the syndrome comprises a Hamming code or a shortened Hamming code.

6. The method of claim 2, wherein the WOM code that is used for said WOM encoding of the redundancy data satisfies the property that parity of t redundancy cells $\Sigma_{i=0}^{t-1} p_i$ and parity of n information cells in the original data vector $\Sigma_{i=0}^{n-1} c_i$ are the same.

7. The method of claim 2, wherein the redundancy data comprises 2r redundancy cells, partitioned into two r-cell groups, $p_1=(p_0,p_1,\ldots,p_{r-1})$ and $p_2=(p_r,p_1,\ldots,p_{2r-1})$ wherein the redundancy groups $p_1$ and $p_2$ store $\lceil \log_2(n+1) \rceil$-bit syndrome vectors $s_1$ and $s_2$, respectively, and the two syndromes correspond to the two roots $\alpha, \alpha^3$ of a double-error correcting BCH code, denoted by $C_{2\text{-}BCH}$, where $\alpha$ is a primitive element in the field $GF(2^{\lceil \log_2(n+1) \rceil})$.

8. The method of claim 7, wherein $[\log_2(n+1)]$ is an odd integer.

9. The method of claim 7, wherein $[\log_2(n+1)]$ is an even integer and an [n+t,k,t] single-error detecting WOM code is used, and the t additional redundancy cells are denoted by $q=(q_0,\ldots,q_{t-1})$;
a root $\alpha^3$ is substituted by the root $\alpha^1$; and
the syndromes $s_1$ and $s_2$ are calculated according to the roots applied to the information cells c and their parity value, which is stored in the new redundancy cells.

10. The method of claim 2, wherein the redundancy data comprises roots of $\alpha_1=\alpha$, $\alpha_2=\alpha^{2^k+1}$, $\alpha_3=\alpha^{2^{3k}+1}$, where $$k = \frac{\lceil \log_2(n+1) \rceil - 1}{2},$$

and there are 3r+t redundancy cells, divided into four groups:
the first t cells $q=(q_0,\ldots,q_{t-1})$ are used with the n information cells to construct an [n+t,k,t] single-error detecting WOM code $C'_W(E_{C'_W}, D_{C'_W})$; and
the other three groups $p_1=(p_0,\ldots,p_{r-1})$, $p_2=(p_r,\ldots,p_{2r-1})$ and $p_3=(p_{2r},\ldots,p_{3r-1})$ constitutes r cells each, and the i-th group, i=1, 2, 3, stores the $\lceil \log_2(n+1) \rceil$-bit syndrome $s_i$ which corresponds to the root $\alpha_i$.

* * * * *